United States Patent
Choi et al.

(10) Patent No.: US 9,349,626 B2
(45) Date of Patent: May 24, 2016

(54) BUFFER UNITS, SUBSTRATE PROCESSING APPARATUSES, AND SUBSTRATE PROCESSING METHODS

(75) Inventors: Kihoon Choi, Cheonan-si (KR); Byung Man Kang, Cheonan-si (KR); Byung Chul Kang, Cheonan-si (KR); Donghyuk Jang, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 565 days.

(21) Appl. No.: 13/483,823

(22) Filed: May 30, 2012

(65) Prior Publication Data

US 2012/0305028 A1 Dec. 6, 2012

(30) Foreign Application Priority Data

May 31, 2011 (KR) .................. 10 2011 0052382
Aug. 19, 2011 (KR) .................. 10 2011 0082680

(51) Int. Cl.
*H01L 21/677* (2006.01)
*H01L 21/67* (2006.01)

(52) U.S. Cl.
CPC .... *H01L 21/67769* (2013.01); *H01L 21/67173* (2013.01); *H01L 21/67178* (2013.01)

(58) Field of Classification Search
None
See application file for complete search history.

(56) References Cited

U.S. PATENT DOCUMENTS

| | | | |
|---|---|---|---|
| 2002/0059686 A1* | 5/2002 | Uemukai | B08B 1/04 15/77 |
| 2006/0045722 A1* | 3/2006 | Hashimoto | H01L 21/68707 414/754 |
| 2006/0124873 A1* | 6/2006 | Anzai | 250/559.4 |
| 2009/0101180 A1* | 4/2009 | Jang et al. | 134/61 |
| 2009/0252578 A1* | 10/2009 | Machida | 414/222.01 |
| 2009/0305612 A1 | 12/2009 | Miyazaki et al. | |
| 2011/0230047 A1* | 9/2011 | Marrs | 438/688 |

FOREIGN PATENT DOCUMENTS

| | | | |
|---|---|---|---|
| CN | 1437042 A | | 8/2003 |
| CN | 101246812 A | | 8/2008 |
| JP | 05-136233 | | 6/1993 |
| JP | 06249966 A | * | 9/1994 |
| JP | 2002-110609 | | 4/2002 |
| JP | 2002-324828 | | 11/2002 |
| JP | 2004-090186 | | 3/2004 |
| JP | 2004-241731 | | 8/2004 |
| JP | 2004-327674 | | 11/2004 |
| JP | 2004327674 A | * | 11/2004 |

(Continued)

OTHER PUBLICATIONS

English Machine Translation of JP 2004-327674 A.*

(Continued)

*Primary Examiner* — Nicole Blan
(74) *Attorney, Agent, or Firm* — Harness, Dickey & Pierce, P.L.C.

(57) ABSTRACT

Provided is a buffer unit, which includes a frame including a base plate, a first vertical plate, and a second vertical plate, wherein the first and second vertical plates are spaced apart from each other on the base plate, a first buffer on which a photomask is placed, the first buffer being allowed to be reversed between the first and second vertical plates; and a plurality of driving parts disposed at outsides of the first and second vertical plates, and driving the first buffer to grip and reverse the photomask placed on the first buffer.

17 Claims, 13 Drawing Sheets

(56) References Cited

FOREIGN PATENT DOCUMENTS

| JP | 2005-093745 | 4/2005 |
| JP | 2008-198882 | 8/2008 |
| JP | 2009-094515 | 4/2009 |
| JP | 2009-145827 | 7/2009 |
| JP | 2010-238783 | 10/2010 |
| JP | 2010-243796 | 10/2010 |
| KR | 10-0899159 B1 | 5/2009 |
| KR | 10-2011-0051177 | 5/2011 |
| TW | 201009987 A | 3/2010 |

OTHER PUBLICATIONS

English Machine Translaton of JP 06-249966 A.*

* cited by examiner

BUFFER UNITS, SUBSTRATE PROCESSING APPARATUSES, AND SUBSTRATE PROCESSING METHODS

CROSS-REFERENCE TO RELATED APPLICATIONS

This U.S. non-provisional patent application claims priority under 35 U.S.C. §119 of Korean Patent Application Nos. 10-2011-0052382, filed on May 31, 2011, and 10-2011-0082680, filed on Aug. 19, 2011, the entire contents of which are hereby incorporated by reference.

BACKGROUND OF THE INVENTION

The present invention disclosed herein relates to a substrate processing apparatus, and more particularly, to a buffer unit in which a photomask temporarily stays, a substrate processing apparatus, and a substrate processing method.

Photomasks are quartz or glass substrates covered with a pattern corresponding to a minute semiconductor circuit. For example, a chrome thin layer applied on an upper layer of a transparent quartz substrate is etched to form a pattern corresponding to a semiconductor integrated circuit or a liquid crystal display (LCD) circuit. The size of the pattern is 1 to 5 times greater than that of the semiconductor integrated circuit or the LCD circuit. A minute pattern of a photomask is formed on a substrate through a photolithography process. In a photolithography process, a photoresist is uniformly applied on a substrate, then, a scale-down projection/exposure process is performed using a pattern of a photomask and an exposure device such as a stepper, and then, a development process is performed to form a two dimensional photoresist pattern.

When a foreign substance is attached to a photomask, the foreign substance scatters or absorbs light during an exposure process, so as to degrade optical resolution, thereby causing a significant defect in a pattern formed on a substrate. Thus, a pellicle as a protective member is installed on a photomask during an exposure process in order to protect the photomask from foreign substances. The pellicle is disposed at a certain height over a pattern of the photomask such that even though a foreign substance is attached to the pellicle, the foreign substance does not affect an image formed on a substrate during the exposure process.

Photomasks may be cleaned in a wet cleaning apparatus using a chemical such as a sulfuric peroxide mixture (SPM). When a photomask to which a foreign substance such as an adhesive is attached is used in an exposure process, as the exposure process is performed, the foreign substance may be gradually grown as a haze defect by catalysis energy of light. Since such growing haze defects cause undesirable pattern transfer, it is needed to effectively remove a foreign substance such as an adhesive from a photomask.

When a photomask is loaded into a photomask cleaning apparatus, a cleaning target surface of the photomask (a pattern surface thereof) may be oriented downward (reversed). To this end, photomask cleaning apparatuses include a device for reversing a photomask. Since such a reversing device is disposed within a photomask cleaning chamber, the reversing device is susceptible to corrosion due to chemical fumes, and particles generated from a driving part may contaminate a photomask and the inside of the photomask cleaning chamber.

SUMMARY OF THE INVENTION

The present invention provides a buffer unit having both a buffer function and a reverse function, a substrate processing apparatus, and a substrate processing method.

The object of the present invention is not limited to the aforesaid, and other objects not described herein will be clearly understood by those skilled in the art from descriptions below.

Embodiments of the present invention provide buffer units including: a frame including a base plate, a first vertical plate, and a second vertical plate, wherein the first and second vertical plates are spaced apart from each other on the base plate; a first buffer on which a substrate is placed, the first buffer being allowed to be reversed between the first and second vertical plates; and a plurality of driving parts disposed at outsides of the first and second vertical plates, and driving the first buffer to grip and reverse the substrate placed on the first buffer.

In some embodiments, the first buffer may include: a first support supporting a surface of the substrate; and a second support facing the first support, and supporting another surface of the substrate placed on the first support, and the driving part may include: a rotation module simultaneously rotating the first support and the second support; and an elevation module vertically moving the second support such that the substrate is gripped by the first and second supports.

In other embodiments, the rotation module may include: a plurality of rotators rotatably installed on the first and second vertical plates, and having a hollow structure; a rotation driver part for rotating the rotators, wherein the elevation module includes: a cylinder fixed to the rotator; and a connecting block that is vertically moved according to driving of the cylinder, and that passes through the rotator to connect to the second support.

In still other embodiments, the frame may further include a plurality of partition covers that cover outer surfaces of the first and second vertical plates to isolate driving part spaces accommodating the driving parts, from an external environment.

In even other embodiments, the frame may further include an intake port for providing discharge pressure to the driving part space defined by the partition cover.

In yet other embodiments, a rotation axis of the first buffer may be eccentric from a center of a grip position of the substrate such that a loading position of the substrate is the same as an unloading position of the substrate after being reversed.

In further embodiments, the buffer units may further include a second buffer having a simple buffer function without reversing the substrate.

In still further embodiments, the second buffer may be installed on the first and second vertical plates, and be disposed under the first buffer.

In other embodiments of the present invention, substrate processing apparatuses include: an index part including an index robot and a port on which a container containing a substrate is placed; a processing part configured to process the substrate; and a buffer unit disposed between the index part and the processing part to reverse the substrate, wherein the substrate transferred the index part and the processing part temporarily stays in the buffer unit.

In some embodiments, the buffer unit may include: a plurality of first buffers on which the substrate is placed; a plurality of driving parts for reversing the first buffer; and a frame including a central space including an open front portion and an open rear portion, and a plurality of driving part spaces disposed at both sides of the central space, wherein the first buffers are disposed in the central space, and the driving parts are disposed in the driving part spaces.

In other embodiments, the frame may include: a first vertical plate and a second vertical plate, which face each other with the central space therebetween; a partition cover surrounding the driving part space to isolate the driving part space from an external environment; and an intake port for providing discharge pressure to the driving part space.

In still other embodiments, the first buffer may include: a first support supporting a surface of the substrate; and a second support facing the first support, and supporting another surface of the substrate placed on the first support, and the driving part may include: a rotation module rotating the first support and the second support; and an elevation module vertically moving the second support such that the substrate is gripped by the first and second supports.

In even other embodiments, a rotation axis of the first buffer may be eccentric from a center of a grip position of the substrate such that a loading position of the substrate is the same as an unloading position of the substrate after being reversed.

In yet other embodiments, the buffer unit may include: a first buffer having a substrate reversing function; and a second buffer having a simple buffer function without reversing the substrate.

In further embodiments, the second buffer may be disposed under the first buffer.

In still further embodiments, the first buffers may be vertically arrayed.

In even further embodiments, the processing part may include a first processing part and a second processing part, which are vertically arrayed, and each of the first processing part and the second processing part may include: a conveyor passage including a transfer robot; and a plurality of modules disposed on a side portion of the conveyor passage, and arrayed along the conveyor passage.

In yet further embodiments, the first processing part may include a glue removal process module and a cool process module, and the second processing part may include a heat process module and a functional water process module.

In still other embodiments of the present invention, substrate processing methods include disposing a buffer unit between a port on which a container is placed, and a processing part configured to process a substrate such that the substrate transferred between the container and the processing part stays in the buffer unit, wherein the substrate is reversed while staying in the buffer unit.

In some embodiments, the substrate may include a photomask, and the processing part may clean the photomask.

In other embodiments, the buffer unit may include a first buffer having a reverse function, and a second buffer having no reverse function, and the substrate disposed in the container may stand by on the second buffer, and then, be transferred to the first buffer.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
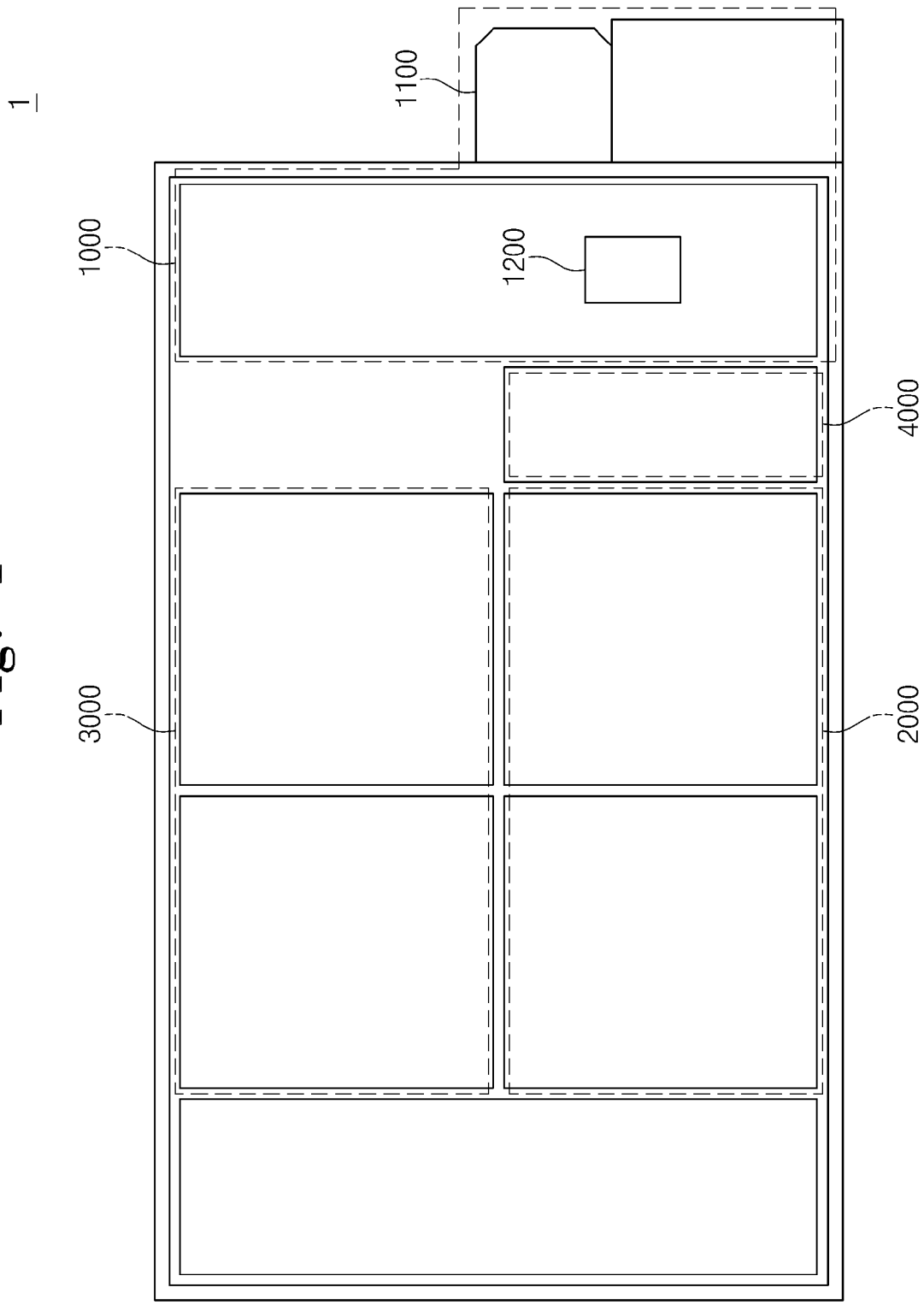
FIG. 1 is a plan view illustrating a layout of a substrate processing apparatus according to an embodiment of the present invention.

Hereinafter, a substrate processing apparatus according to exemplary embodiments of the present invention will be described in detail with reference to the accompanying drawings. Like reference numerals denote like elements throughout. Moreover, detailed descriptions related to well-known functions or configurations will be ruled out in order not to unnecessarily obscure subject matters of the present invention.

EMBODIMENTS

FIG. 1 is a plan view illustrating a layout of a substrate processing apparatus according to an embodiment of the present invention.

Figure 2:
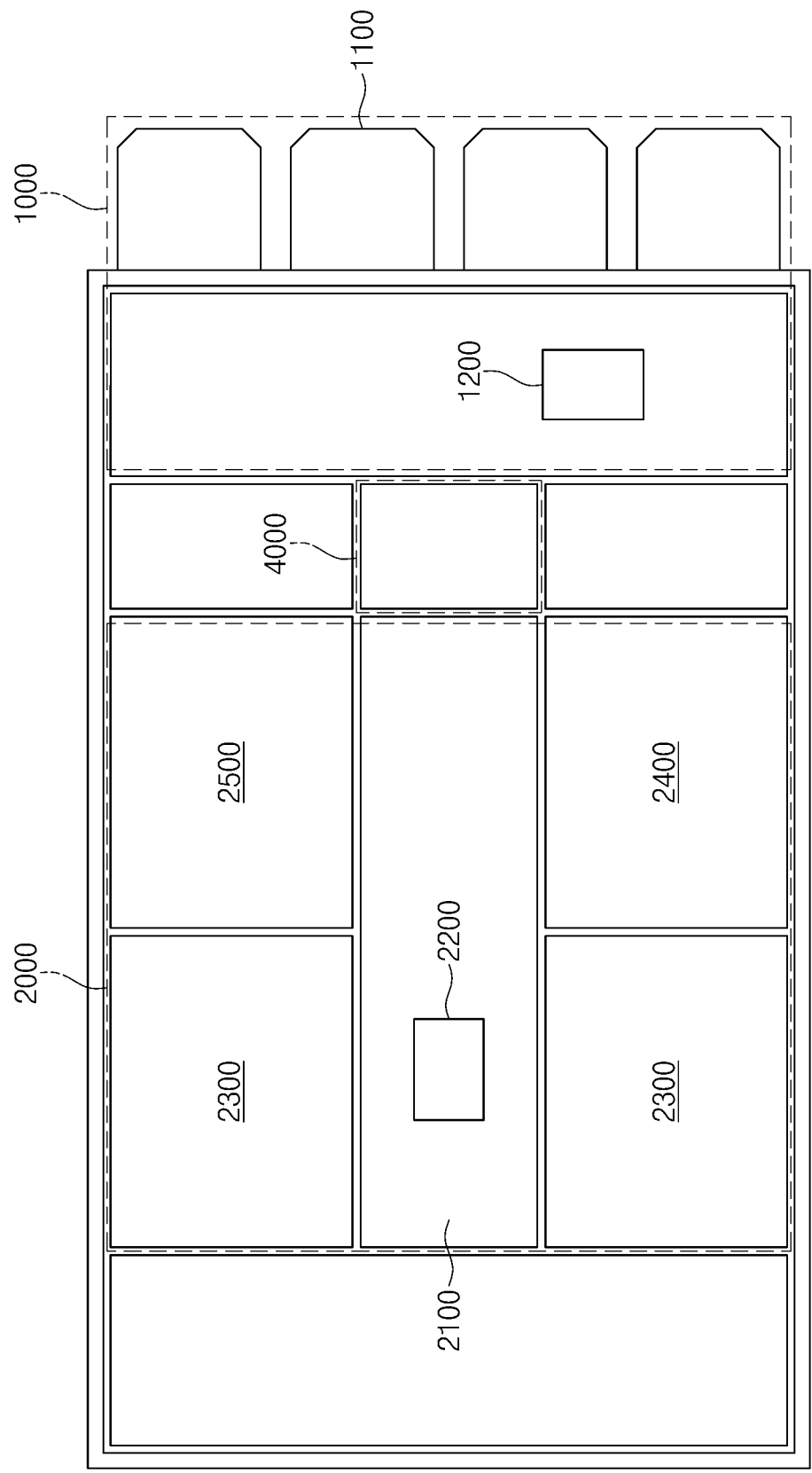
FIG. 2 is a plan view illustrating a layout of a first floor within the substrate processing apparatus of FIG. 1.
Figure 3:
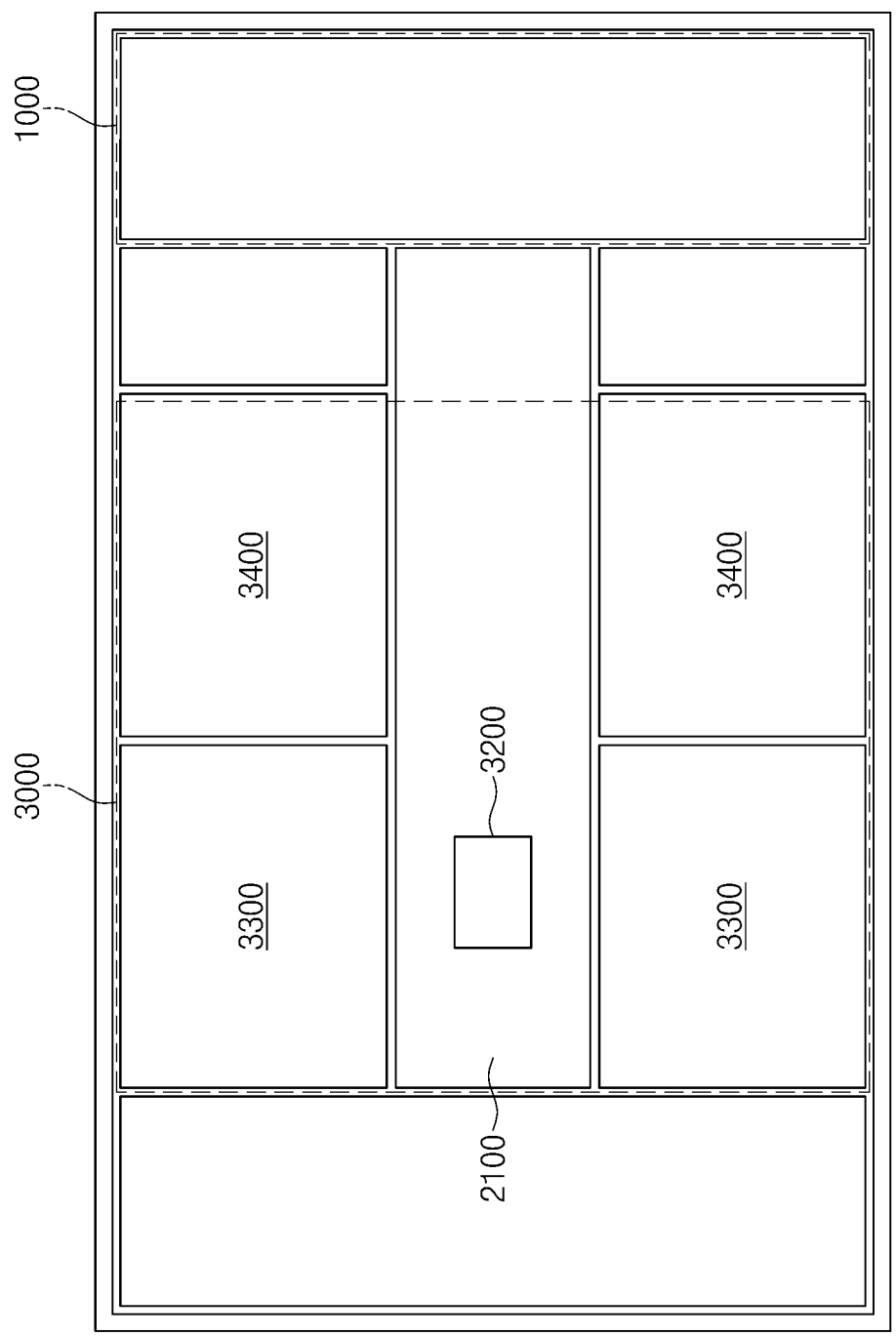
FIG. 3 is a plan view illustrating a layout of a second floor within the substrate processing apparatus of FIG. 1.

FIGS. 2 and 3 are plan views illustrating layouts of a first floor and a second floor within the substrate processing apparatus of FIG. 1.

In the current embodiment, a photomask is exemplified as a substrate. However, various substrates such as a semiconductor wafer and a flat display panel may be exemplified. In addition, in the current embodiment, a photomask cleaning apparatus is exemplified as a substrate processing apparatus. However, an apparatus for cleaning a substrate such as a wafer may be exemplified as a substrate processing apparatus. Furthermore, not only a substrate processing apparatus for cleaning a substrate such as a photomask or a wafer, but also a substrate processing apparatus for processing the back side of a substrate may be exemplified.

Referring to FIGS. 1 to 3, a substrate processing apparatus 1 according to the current embodiment includes an index part 1000, a processing part 200, and a buffer unit 4000.

The index part 1000 includes four ports 1100 on which containers containing photomasks are placed, and an index robot 1200 for transferring the photomasks. When the containers are placed on the ports 1100, the photomasks are reversed such that pattern surfaces thereof are oriented downward. Thus, contamination of the pattern surfaces can be minimized. Before the photomask is transferred to a first processing part 2000 or a second processing part 3000, the photomask is reversed again in the buffer unit 4000 such that the pattern surface is oriented upward.

The processing part 200 includes the first processing part 2000 and the second processing part 3000. A wet cleaning process is performed on a photomask in the first processing part 2000. The first processing part 2000 is connected to the buffer unit 4000 as a reverse buffer part, and includes: a first conveyor passage 2100 including a first transfer robot 2200 for transferring a photomask; a plurality of glue removal process modules (HSU and GSU) 2300 and 2400, which are arrayed along the first conveyor passage 2100; and a cool process module (CPU) 2500 for cooling a photomask.

The number of the glue removal process modules 2300 and 2400 may be three, and the number of cool process modules 2500 may be two.

The glue removal process modules 2300 and 2400 may include: an entire process module (HSU) 2300 that removes glue by applying a sulfuric peroxide mixture (SPM) solution to the entire surface of a photomask; and a partial process module (HSU) 2400 that removes glue by partially applying the SPM solution to the edge of a photomask. The cool process module 2500 cools a photomask heat-processed in heat process modules 3300, to a room temperature.

The first processing part 2000 and the second processing part 3000 are disposed on different floors. A dry and functional water cleaning process is performed on a photomask in the second processing part 3000. The second processing part 3000 includes: a second conveyor passage 3100 including a second transfer robot 3200 for transferring a photomask; and a plurality of the heat process modules (HPU) 3300 and functional water process modules (SCU) 3400, which are arrayed along the second conveyor passage 3100. The heat process modules 3300 may use ultraviolet rays to heat a photomask. The number of the heat process modules 3300 may be two, and the number of the functional water process modules 3400 may be two.

The buffer unit 4000 is disposed between the processing part 200 and the index part 1000. For example, the buffer unit 4000 is disposed between the index part 1000 and the first processing part 2000. Alternatively, the buffer unit 4000 may be disposed between the second processing part 3000 and the index part 1000. The buffer unit 4000 reverses a photomask.

Modules for performing a wet cleaning process are disposed on the first floor of the substrate processing apparatus 1, and modules for performing a dry cleaning process are disposed on the second floor thereof. That is, a wet cleaning process using a chemical solution is performed on the first floor so as to protect a dry-processed photomask from ion contamination due to a down flow. Alternatively, modules for performing a wet cleaning process and modules for performing a dry cleaning process may be disposed on the same floor of the substrate processing apparatus 1.

As in the current embodiment, a processing part may include a glue removal process module, a photomask cool process module, a heat process module, and a functional water process module. However, the types of processing modules constituting the processing part may be varied according to the type of a substrate to be processed, and a process therefor.

A substrate processing apparatus according to an embodiment of the present invention may simultaneously process five photomasks, thereby improving productivity.

Since a pattern surface of a photomask includes chrome (Cr), the pattern surface is susceptible to static electricity. Thus, a substrate processing apparatus according to an embodiment of the present invention may includes ionizers within moving passages (a first conveyor passage, a second conveyor passage, and processing modules corresponding thereto) to minimize damage due to static electricity.

Figure 4:
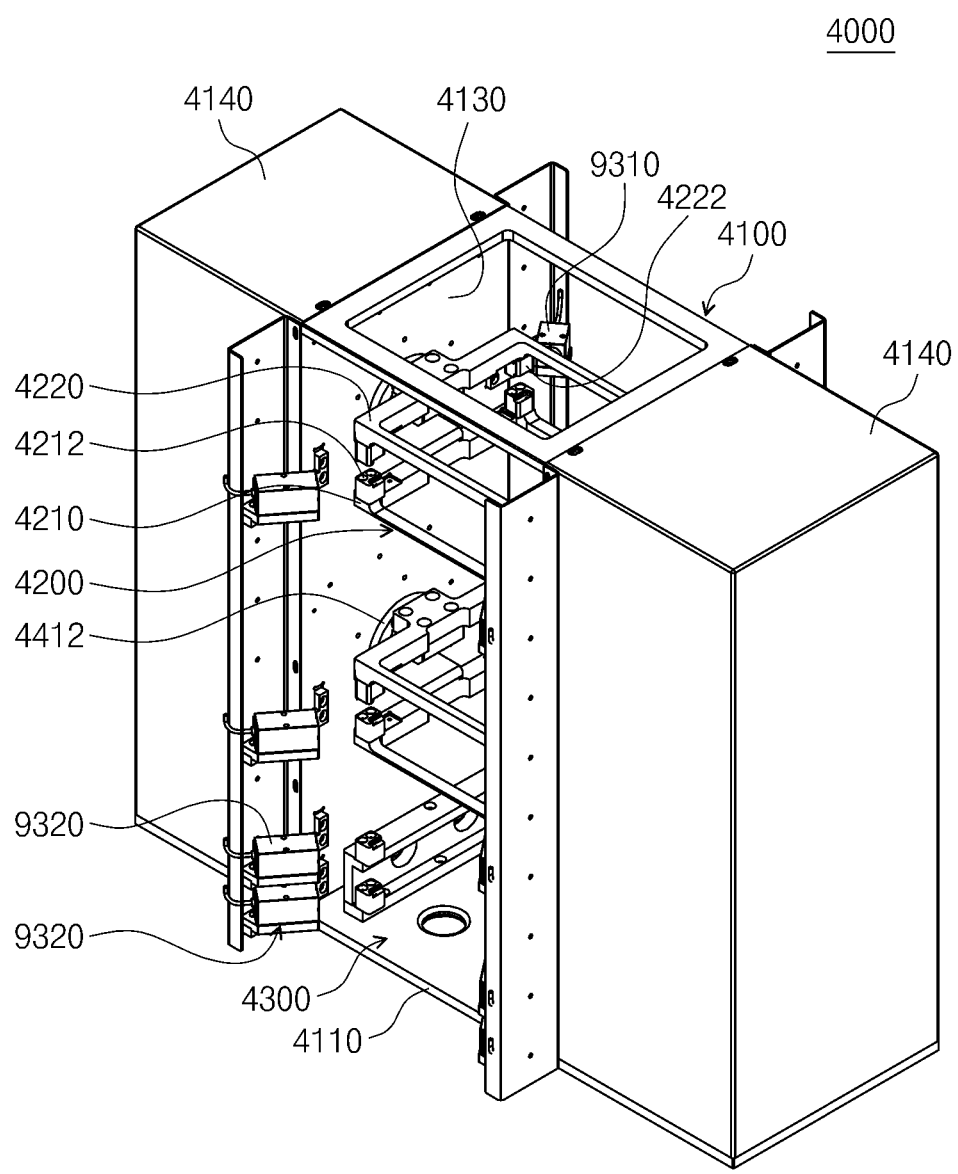
FIG. 4 is a perspective view illustrating a buffer unit according to an embodiment of the present invention.
Figure 5:
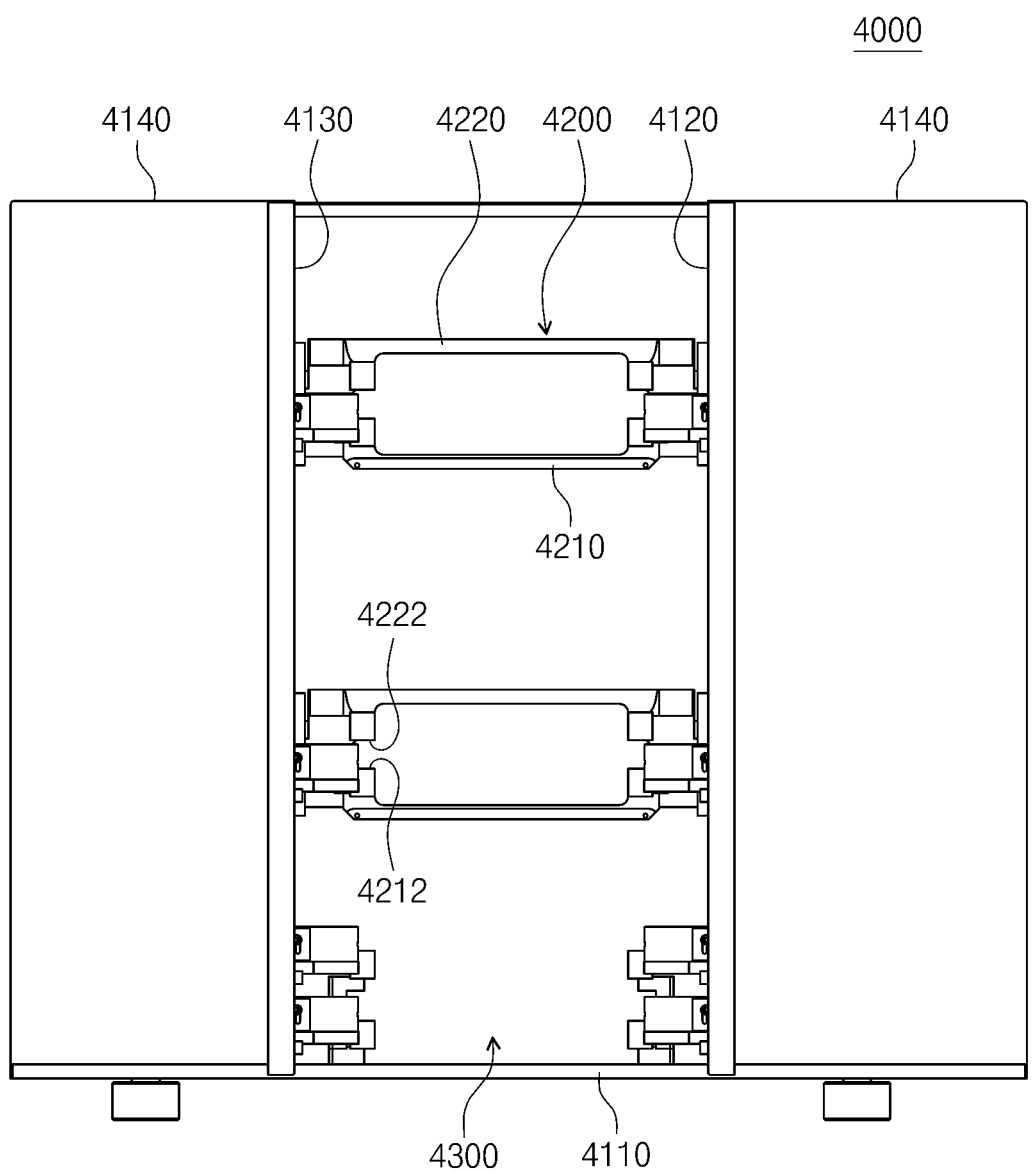
FIG. 5 is a front view illustrating the buffer unit of FIG. 4.
Figure 6:
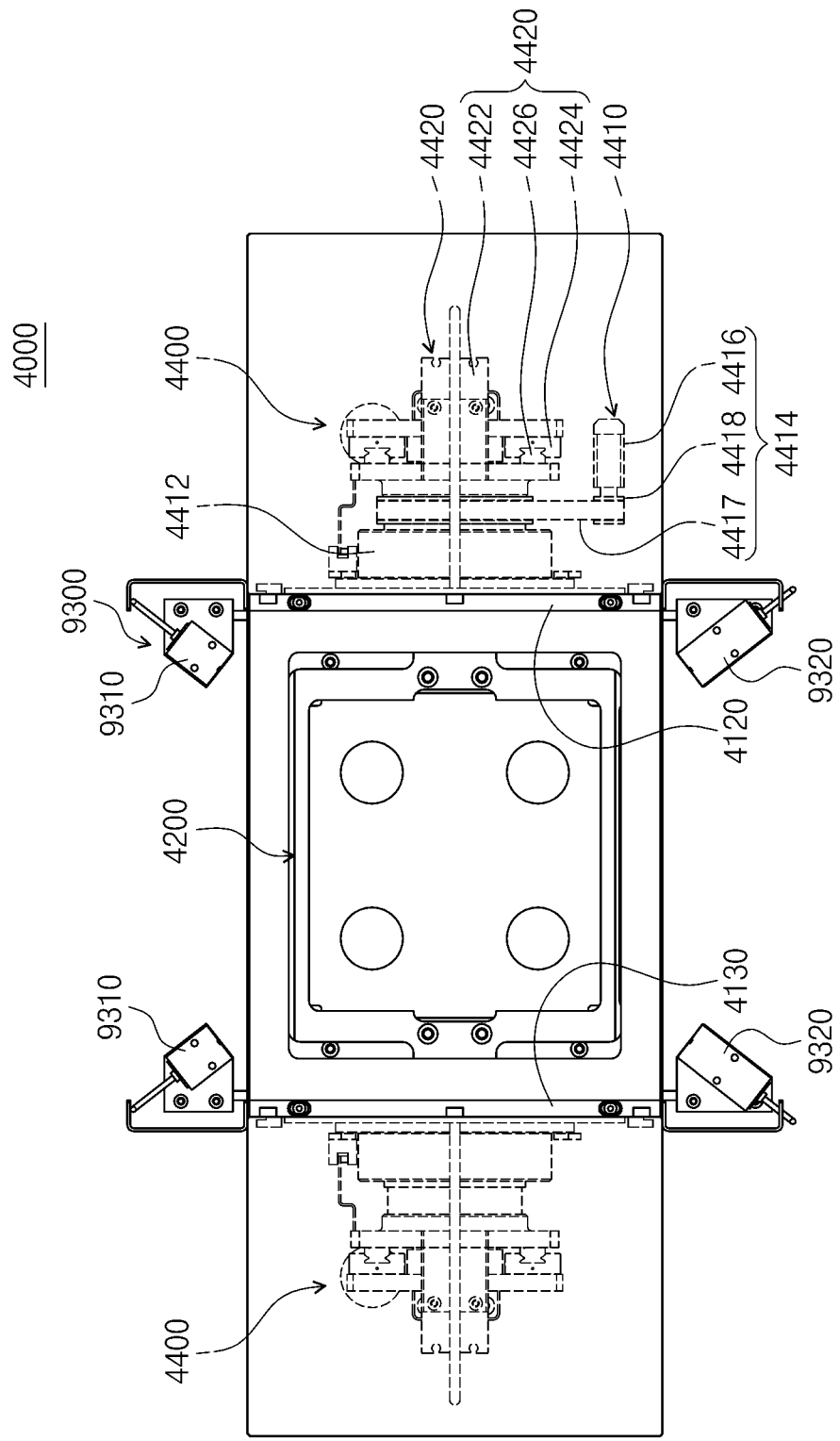
FIG. 6 is a plan view illustrating the buffer unit of FIG. 4.
Figure 7:
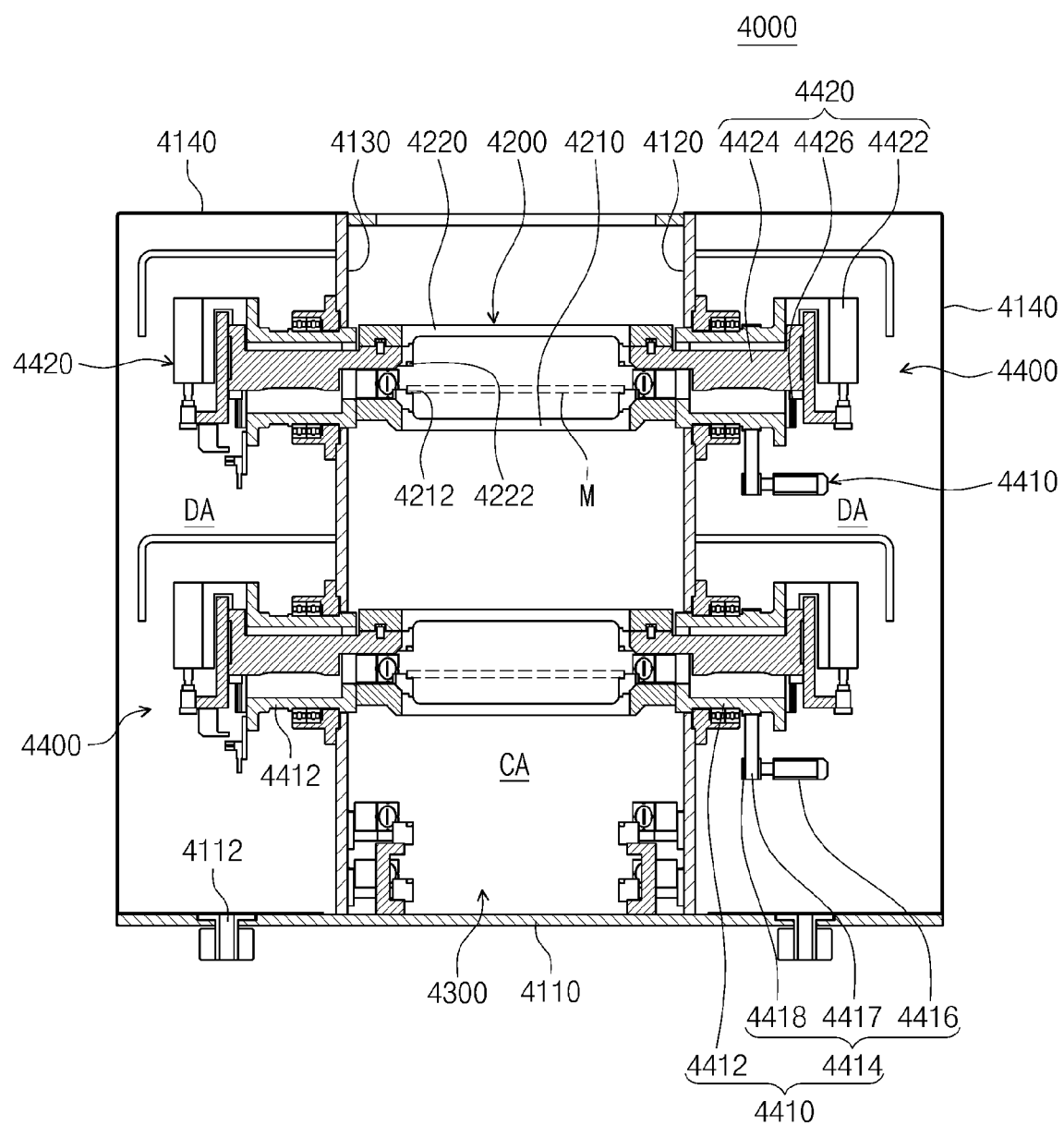
FIG. 7 is a cross-sectional view illustrating the buffer unit of FIG. 4.

FIG. 4 is a perspective view illustrating a buffer unit according to an embodiment of the present invention. FIG. 5 is a front view illustrating the buffer unit of FIG. 4. FIG. 6 is a plan view illustrating the buffer unit of FIG. 4. FIG. 7 is a cross-sectional view illustrating the buffer unit of FIG. 4.

Referring to FIGS. 4 to 7, the buffer unit 4000 includes a frame 4100, a plurality of first buffers 4200 having a reversing function, a second buffer 4300 having a simple buffer function, and a plurality of driving parts 4400. Two first buffers and two second buffers may be provided.

The frame 4100 includes a base plate 4110, a first vertical plate 4120, a second vertical plate 4130, and two partition covers 4140.

The first vertical plate 4120 and the second vertical plate 4130 are perpendicular to the base plate 4110. The first vertical plate 4120 and the second vertical plate 4130 are spaced apart from each other. A space between the first and second vertical plates 4120 and 4130 is referred to as a central space CA (in which a photomask is stored and reversed). A right space of the first vertical plate 4120 and a left space of the second vertical plate 4130 are referred to as driving part spaces DA, respectively. The central space CA has an open front portion and an open rear portion through which a photomask is put in or taken out. The first buffers 4200 and the second buffer 4300 are arrayed in a multi-stage structure within the central space CA. The driving parts 4400 are disposed within the driving part spaces DA. The driving part spaces DA are isolated from an external environment by the partition covers 4140. The base plate 4110 includes intake ports 4112 to form discharge pressure (negative pressure) within the driving part spaces DA. That is, the driving part spaces DA are isolated from the external environment by the partition covers 4140, and the discharge pressure (negative pressure) formed by the intake ports 4112 prevents air from flowing from the driving part spaces DA to the central space CA.

The second buffer 4300 is disposed under the first buffers 4200, and has a simple buffer function.

The first buffers 4200 are rotatably installed on the first and second vertical plates 4120 and 4130. Each of the first buffers 4200 includes a fixing holder 4210 as a first support, and a gripper holder 4220 as a second support. The fixing holder 4210 faces the gripper holder 4220. The gripper holder 4220 vertically moves to hold an edge of a photomask M placed on the fixing holder 4210. The fixing holder 4210 and the gripper holder 4220 have tetragonal frame shapes in plan view. Referring to FIG. 4, the fixing holder 4210 includes support protrusions 4212 at an edge thereof to support the edge of the photomask M, and the gripper holder 4220 includes support protrusions 4222 at an edge thereof to support the edge of the photomask M.

The driving parts 4400 include a rotation module 4410 and an elevation module 4420. The driving parts 4400 are disposed within the driving part spaces DA to prevent particles generated from the driving parts 4400 from contaminating a photomask.

The rotation module 4410 includes two rotators 4412 and a rotation driver part 4414.

The rotators 4412 correspond to the first and second vertical plates 4120 and 4130, respectively. The rotation driver part 4414 is disposed on the first vertical plate 4120. The rotation driver part 4414 includes a motor 4416, a belt 4417, and a pulley 4418 to reverse the rotators 4412 through about 180°. The rotator 4412 has a hollow structure with an inner passage. Both ends of the fixing holder 4210 are fixed to the rotators 4412.

The elevation module 4420 includes a cylinder 4422, a connecting block 4424, and a linear motion (LM) guide 4426. The cylinder 4422 is fixed to an outer portion of the rotator 4412 in the driving part space DA. The connecting block 4424 is vertically moved according to driving of the cylinder 4422. The LM guide 4426 is fixed to the rotator 4412. The LM guide

4426 guides the connecting block 4424 that is vertically moved according to driving of the cylinder 4422. The connecting block 4424 is connected to the gripper holder 4220 disposed within the central space CA through the inner passage of the rotator 4412.

The buffer unit 4000 includes sensing members 9300 for sensing instable placement of the photomask M. The sensing members 9300 are disposed at photomask loading/unloading heights of the first and second buffers 4200 and 4300. The sensing members 9300 are diagonally disposed for a cross check.

Figure 8A:
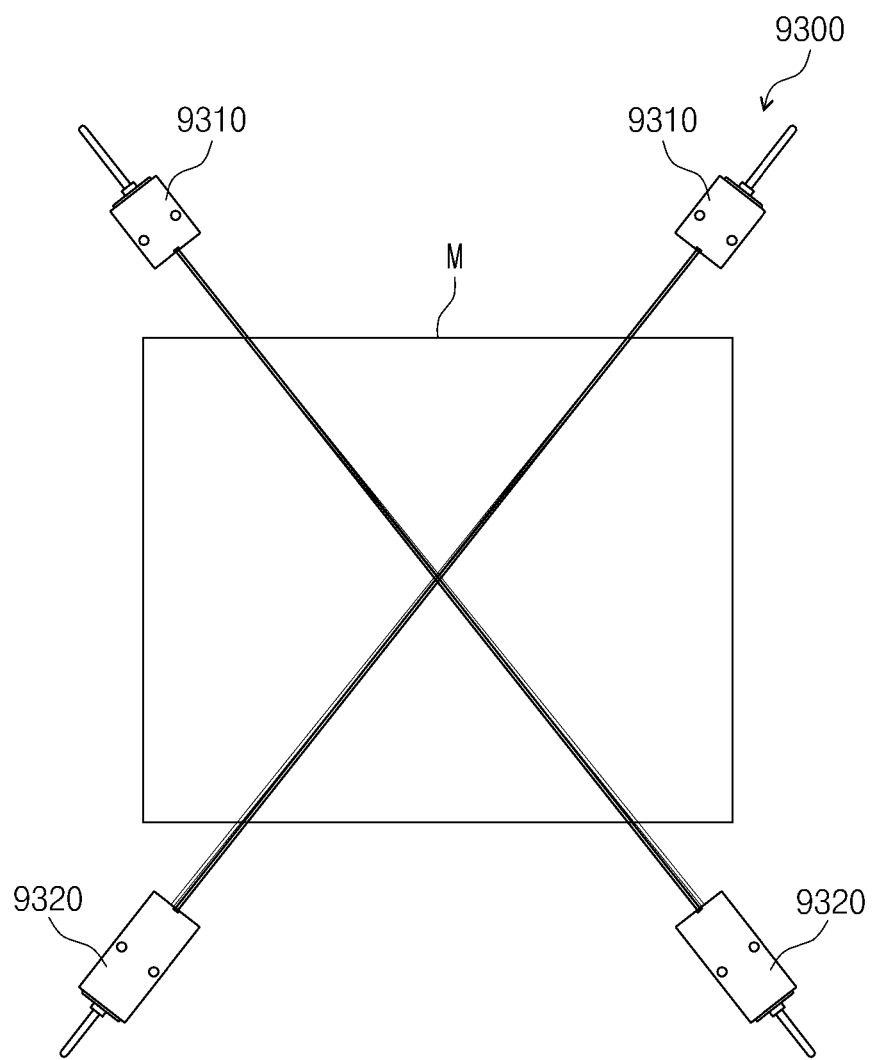
FIGS. 8A and 8B are a plan view and a side view illustrating sensing members of FIG. 6.
Figure 8B:
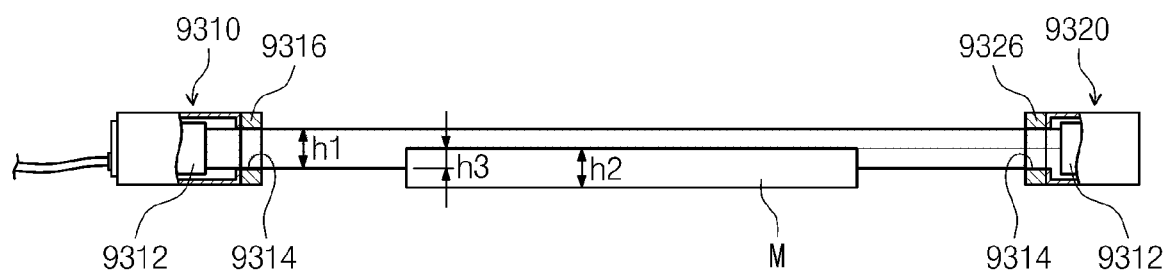
Figure 9:
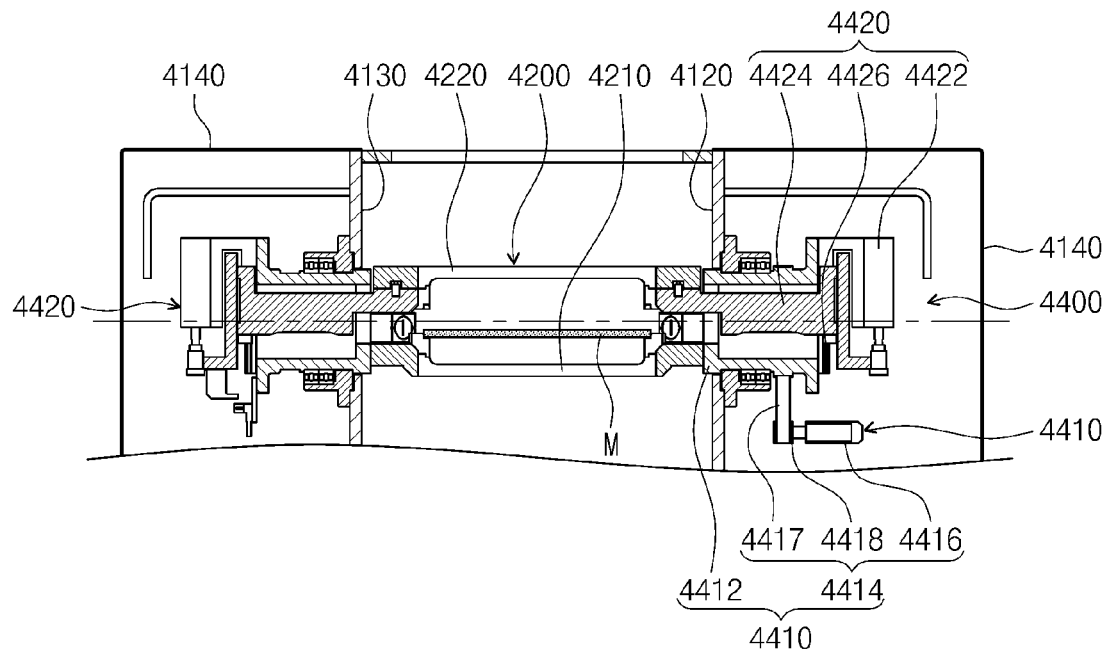
FIGS. 9 to 12 are cross-sectional views illustrating a process that a photomask is reversed in a first buffer according to an embodiment of the present invention.
Figure 10:
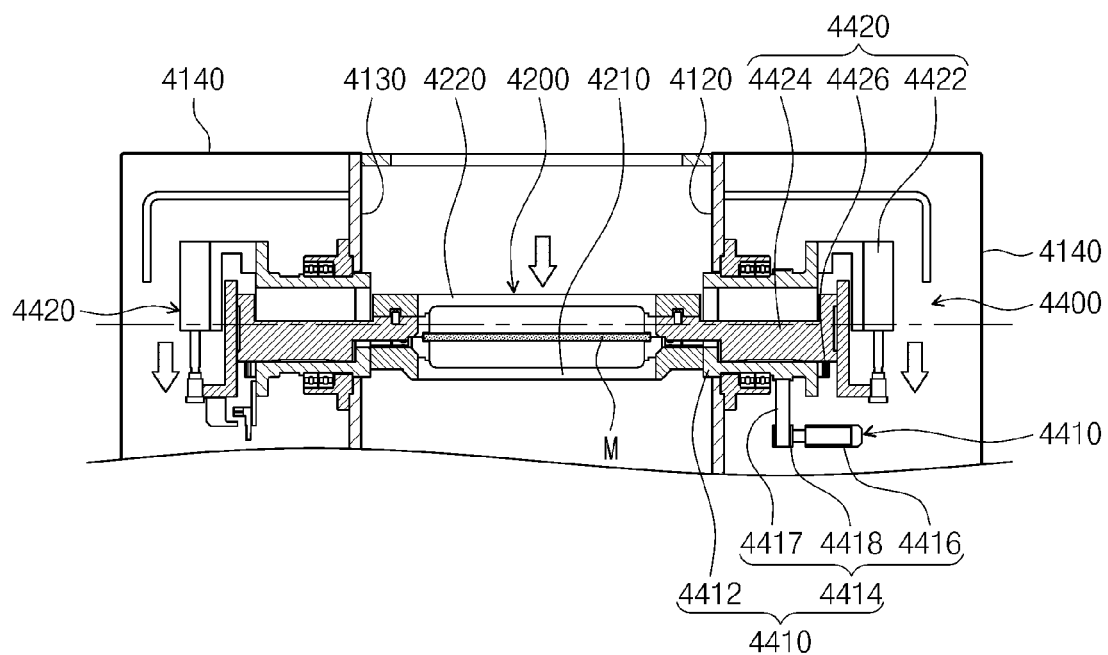
Figure 11:
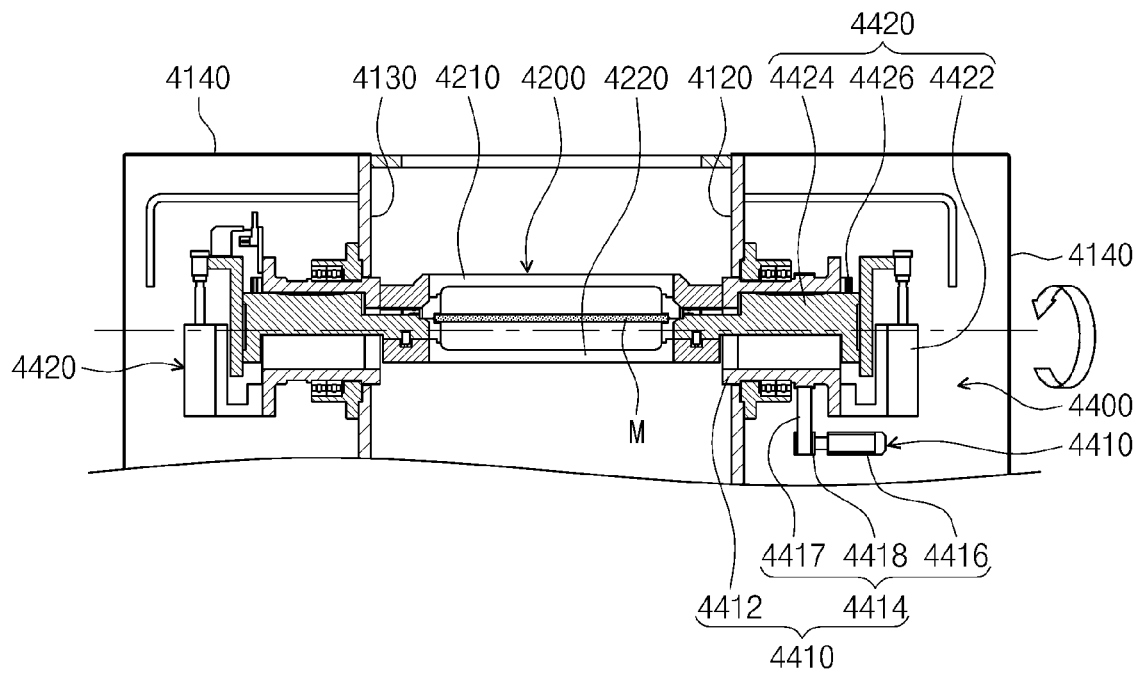
Figure 12:
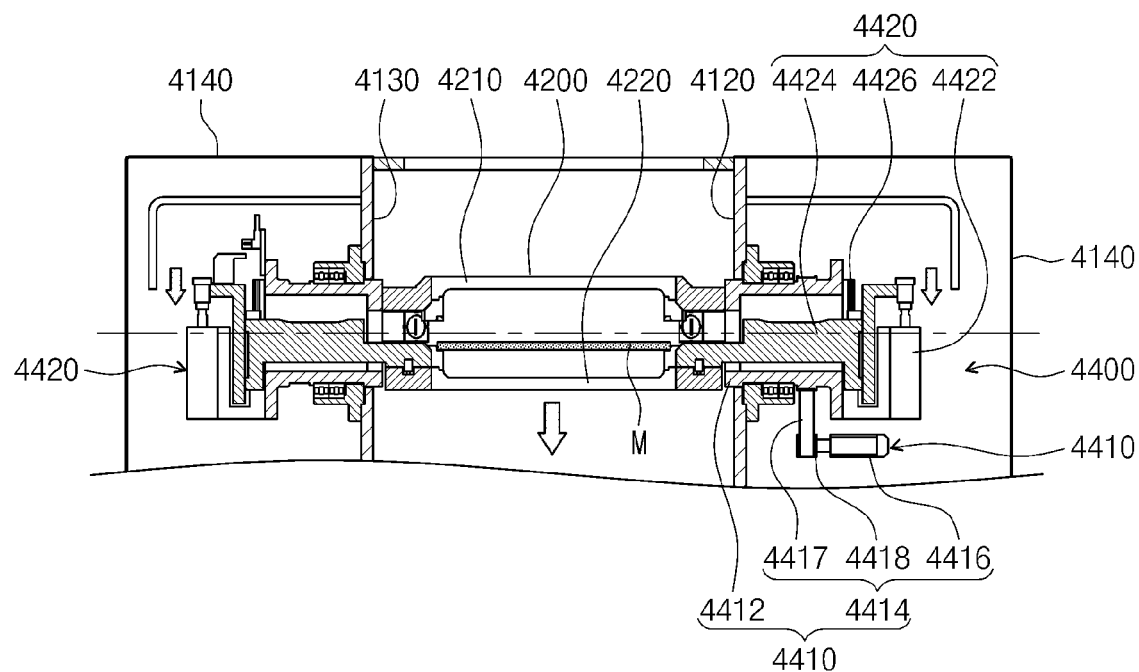

FIGS. 8A and 8B are a plan view and a side view illustrating sensing members of FIG. 6.

Referring to FIGS. 8A and 8B, the sensing members 9300 are disposed around a corresponding buffer. The sensing members 9300 may simultaneously sense the presence of the photomask M and a photomask loading failure. The sensing members 9300 include pairs of a light emitting part 9310 and a light receiving part 9320. The light emitting part 9310 emits a laser beam, and the light receiving part 9320 receives the laser beam. The light emitting part 9310 and the light receiving part 9320 are disposed to propagate a laser beam along a diagonal direction of the photomask M. That is, the laser beam is inclined from a side of the photomask M.

The light emitting part 9310 includes a light emitting sensor 9312 emitting a laser beam, and a first light blocking plate 9316 including a first slit 9314 limiting a beam width of a laser beam. A laser beam emitted from the light emitting part 9310 has a vertical slit shaped cross section.

The light receiving part 9320 includes: a second light blocking plate 9326 including a second slit 9324 through which a laser beam emitted from the light emitting part 9310 passes; and a light receiving sensor 9322 disposed behind the second light blocking plate 9326, and sensing intensity of a laser beam incident through the second slit 9324.

A height h1 of the laser beam is greater than a height h2 of the photomask M, and the laser beam passes through a portion of the photomask M. For example, the photomask M may have a height (thickness) of about 6.35 mm, and the height h1 of the laser beam may be about 10 mm. In this case, a portion of the laser beam passing through the photomask M may have a height h3 of about 5 mm to efficiently sense the presence of the photomask M and a photomask loading failure. That is, a half (a height of 5 mm) of the laser beam may pass through the photomask M. Since the portion of the laser beam (passing through the photomask M) is obliquely incident to a side surface of the photomask M, the portion of the laser beam is refracted within the photomask M, and thus, is not incident to the second slit 9324. Thus, only a portion of the laser beam, passing over the top surface of the photomask M, is incident to the second slit 9324, so that sensed intensity of the laser beam is decreased.

FIGS. 9 to 12 are cross-sectional views illustrating a process that a photomask is reversed in a first buffer according to an embodiment of the present invention.

Referring to FIGS. 9 to 12, the photomask M is transferred to the central space CA of the buffer unit 4000 as a reverse buffer part by a transfer device (not shown), and is loaded to the fixing holder 4210. Then, the gripper holder 4220 is moved downward by the elevation module 4420 to support the photomask M from the upper side thereof. When the photomask M is fixed by the fixing holder 4210 and the gripper holder 4220, the first buffer 4200 is reversed by the rotation module 4410. After that, the gripper holder 4220 is disposed at the lower side, and the fixing holder 4210 is disposed at the upper side. The gripper holder 4220 is moved downward by the elevation module 4420 to release the photomask M. Then, the photomask M held by the gripper holder 4220 is moved to a loading/unloading position.

At this point, a rotation axis of the photomask M, depicted with dot-dash line, is disposed above the photomask M. That is, the rotation axis of the photomask M is eccentric from the center of a placement position of the photomask M (the loading/unloading position thereof), so that the initial loading position of the photomask M is the same as an unloading position after the reversing of the photomask M.

Figure 13:
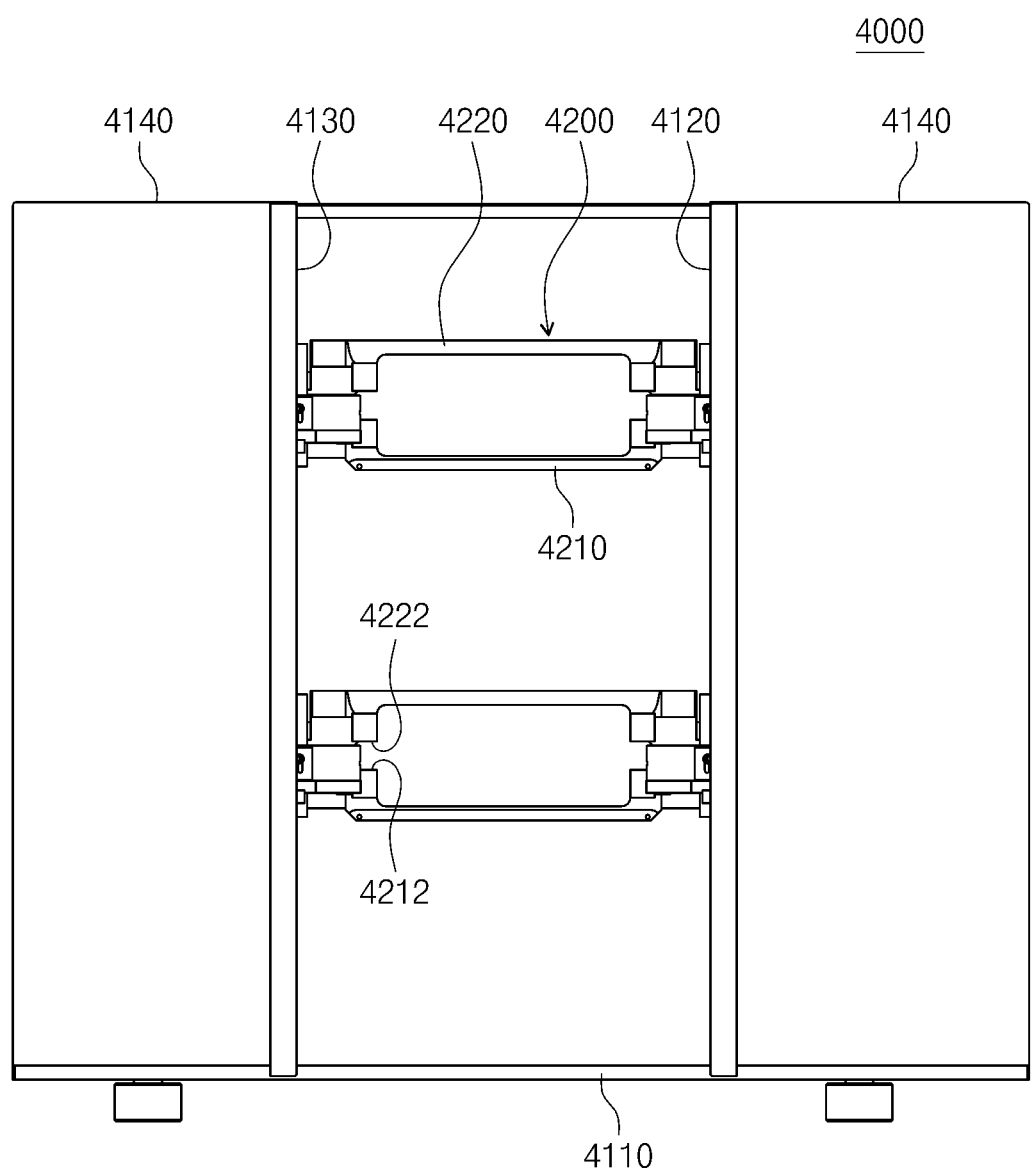
FIG. 13 is a side view illustrating a buffer unit including only first buffers according to an embodiment of the present invention.
Figure 14:
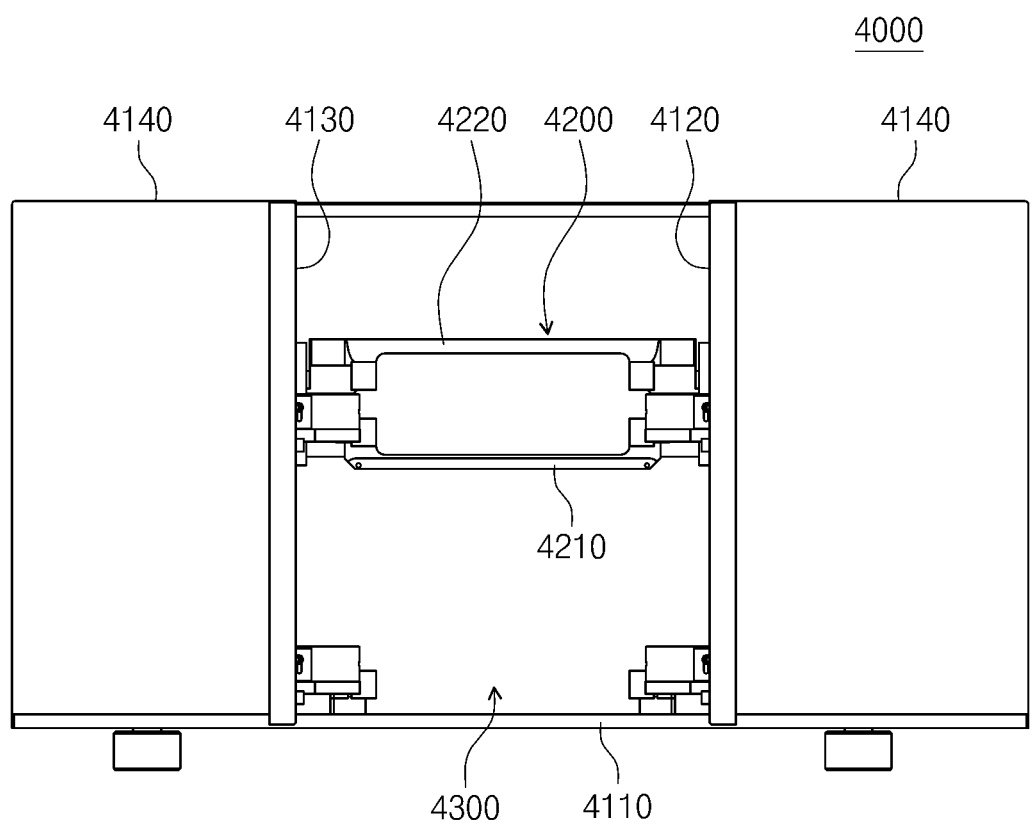
FIG. 14 is a side view illustrating a buffer unit including a first buffer and a second buffer according to an embodiment of the present invention.

FIG. 13 is a side view illustrating a buffer unit including only first buffers according to an embodiment of the present invention. FIG. 14 is a side view illustrating a buffer unit including a first buffer and a second buffer according to an embodiment of the present invention.

Referring to FIG. 13, a buffer unit 4000 may include only first buffers 4200 having a reverse function.

Referring to FIG. 14, a buffer unit 4000 may include a first buffer 4200 and a second buffer 4300. Alternatively, the number of first buffers may be different from that of the second buffers, as in the embodiment of FIG. 5. Furthermore, a first buffer and a second buffer may change the positions thereof.

According to the embodiments, a buffer function may be integrated with a reverse function.

In addition, contamination of a photomask can be minimized.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A buffer unit comprising:
a frame including a base plate, a first vertical plate, a second vertical plate, and a plurality of partition covers that cover outer surfaces of the first and second vertical plates, wherein the first and second vertical plates are spaced apart from each other on the base plate;
a plurality of first buffers on each of which a substrate is placed, each of the plurality of first buffers configured to be reversed between the first and second vertical plates, each of the plurality of first buffers including a first support and a second support, the first support configured to support a surface of the substrate, the second support facing the first support and configured to support an another surface of the substrate; and
a plurality of driving parts within a driving part space, the driving part space being entirely outside the first and second vertical plates, the plurality of driving parts including a rotation module and an elevation module, the rotation module configured to rotate the first buffer, the elevation module configured to vertically move the second support such that the substrate is gripped by the first and second supports, and the plurality of driving parts each configured to drive the first buffer to grip and reverse the substrate placed on the first buffer,
wherein the driving part space is a space enclosed by the base plate and a pair of one of the first vertical plate and the second vertical plate and one of the plurality of partition covers, and the driving part space includes two or more of the driving parts.

2. The buffer unit of claim 1, wherein the rotation module comprises
a plurality of rotators rotatably disposed on the first and second vertical plates, and having a hollow structure, and
a rotation driver part configured to rotate the rotators, wherein the elevation module comprises
a cylinder fixed to the rotator, and
a connecting block configured to vertically move according to driving of the cylinder, and pass through the rotator to be coupled to the second support.

3. The buffer unit of claim 1, wherein the frame further comprises an intake port provided in the driving part space and configured to provide discharge pressure to the driving part space.

4. The buffer unit of claim 1, wherein a rotation axis of the first buffer is eccentric from a center of a grip position of the substrate such that a loading position of the substrate is the same as an unloading position of the substrate after being reversed.

5. The buffer unit of claim 1, further comprising:
a second buffer configured to perform a buffer function without reversing the substrate.

6. The buffer unit of claim 5, wherein the second buffer is installed on the first and second vertical plates, and is disposed under the first buffer.

7. A substrate processing apparatus comprising:
an index part including an index robot and a port on which a container configured to contain a substrate is placed;
a processing part configured to process the substrate; and
a buffer unit between the index part and the processing part, the buffer unit configured to reverse the substrate and temporarily store the substrate transferred to and from the index part and the processing part, the buffer unit including
a plurality of first buffers on which the substrate is placed, the plurality of first buffers each including a first support and a second support, the first support configured to support a surface of the substrate, the second support facing the first support and configured to support an another surface of the substrate;
a plurality of driving parts each including a rotation module and an elevation module, the rotation module configured to rotate corresponding one of the plurality of first buffers, the elevation module configured to vertically move the second support such that the substrate is gripped by the first and second supports, the plurality of driving parts configured to reverse the plurality of first buffers, respectively, and
a frame including a central space and a plurality of driving part spaces at sides of the central space, the central space having an open front portion and an open rear portion, wherein
the plurality of first buffers are in the central space,
the driving parts are entirely within the driving part spaces, and
each of the driving part spaces is a space enclosed by a base plate and a pair of one of vertical plates and one of a plurality of partition covers, and each of the driving part spaces includes two or more of the driving parts.

8. The substrate processing apparatus of claim 7, further comprising:
an intake port provided in each of the driving part spaces and configured to provide discharge pressure to each of the driving part spaces.

9. The substrate processing apparatus of claim 7, wherein a rotation axis of the corresponding one of the plurality of first buffers is eccentric from a center of a grip position of the substrate such that a loading position of the substrate is the same as an unloading position of the substrate after being reversed.

10. The substrate processing apparatus of claim 7, further comprising:
a second buffer configured to perform a simple buffer function without reversing the substrate.

11. The substrate processing apparatus of claim 10, wherein the second buffer is disposed under the plurality of first buffers.

12. The substrate processing apparatus of claim 7, wherein the plurality of first buffers are vertically arranged.

13. The substrate processing apparatus of claim 7, wherein the processing part comprises a first processing part and a second processing part, which are vertically arrayed, and
each of the first processing part and the second processing part comprises
a conveyor passage including a transfer robot, and
a plurality of modules disposed on a side portion of the conveyor passage, and arranged along the conveyor passage.

14. The substrate processing apparatus of claim 13, wherein the first processing part comprises a glue removal process module and a cool process module, and
the second processing part comprises a heat process module and a functional water process module.

15. The substrate processing apparatus of claim 7, further comprising:
a plurality of sensors, each corresponding to one of the plurality of first buffers, the sensors configured to sense a presence of the substrate.

16. The substrate processing apparatus of claim 15, wherein the plurality of sensors includes at least a light emitter and a light receiver pair, in which the light emitter and the light receiver are arranged opposite to each other along a diagonal direction of the substrate.

17. The substrate processing apparatus of claim 16, wherein a laser beam emitted by each light emitter is configured to be slightly higher than the substrate such that some portion of the laser beam does not reach the corresponding light receiver, while other portions of the laser beam pass over a top surface of the substrate and reaches the corresponding light receiver.

* * * * *